(12) United States Patent
Griebeler

(10) Patent No.: US 9,955,564 B2
(45) Date of Patent: Apr. 24, 2018

(54) DIELECTRIC BARRIER DISCHARGE DEVICE

(71) Applicant: Elmer Griebeler, Chesterfield, OH (US)

(72) Inventor: Elmer Griebeler, Chesterfield, OH (US)

( * ) Notice: Subject to any disclaimer, the term of this patent is extended or adjusted under 35 U.S.C. 154(b) by 0 days.

(21) Appl. No.: 15/621,201

(22) Filed: Jun. 13, 2017

(65) Prior Publication Data

US 2017/0359887 A1    Dec. 14, 2017

Related U.S. Application Data

(60) Provisional application No. 62/349,373, filed on Jun. 13, 2016.

(51) Int. Cl.

| | |
|---|---|
| *B64C 23/00* | (2006.01) |
| *F03H 1/00* | (2006.01) |
| *H01J 61/54* | (2006.01) |
| *H05H 1/24* | (2006.01) |
| *H01J 37/08* | (2006.01) |

(52) U.S. Cl.
CPC .......... *H05H 1/2406* (2013.01); *H01J 37/08* (2013.01); *H05H 2001/2412* (2013.01); *H05H 2001/2418* (2013.01); *H05H 2001/2443* (2013.01)

(58) Field of Classification Search
None
See application file for complete search history.

(56) References Cited

U.S. PATENT DOCUMENTS

| | | | | |
|---|---|---|---|---|
| 7,624,941 | B1* | 12/2009 | Patel | B62D 35/007 244/200.1 |
| 8,016,247 | B2* | 9/2011 | Schwimley | B64C 23/005 244/200 |
| 8,308,112 | B2* | 11/2012 | Wood | B64C 23/005 244/203 |
| 2012/0193483 | A1* | 8/2012 | Essenhigh | B64C 23/005 244/205 |
| 2013/0221236 | A1* | 8/2013 | Mastenbroek | H01J 65/046 250/435 |

* cited by examiner

*Primary Examiner* — Ashok Patel
(74) *Attorney, Agent, or Firm* — George W. Moxon, II; Brian P. Harrod

(57) ABSTRACT

A dielectric barrier discharge actuator comprising a first electrode disposed adjacent on a surface of a dielectric; a second electrode disposed under the surface and downstream of the first electrode, relative to a flow direction of an ionized layer; an electrical ballast, a third electrode disposed on the surface of the dielectric downstream from the second electrode, connected to the second electrode through the ballast; a series of equal potential strips disposed across the surface of the dielectric and aligned perpendicular to the flow direction of the ionized layer; and a voltage source for applying a voltage across the first and second electrodes, to cause ionization of air between the first electrode and the surface of the dielectric, and to accelerate the ions across the surface of the dielectric; whereby an ionized layer is created when the first electrode is energized by the voltage source.

3 Claims, 4 Drawing Sheets

DIELECTRIC BARRIER DISCHARGE DEVICE

CROSS REFERENCE TO OTHER APPLICATIONS

This application claims the benefit of U.S. Provisional Application No. 62/349,373, filed Jun. 13, 2016.

BACKGROUND OF THE INVENTION

The present invention relates to an improved dielectric barrier discharge (DBD) plasma actuator which can be used for drag reduction on wings, nacelles and/or fuselage of aerodynamic vehicles and devices, such as aircraft, cars, turbines, and the like.

DBD actuators are known and used to form a low-temperature plasma between a pair of asymmetric electrodes by application of a high-voltage AC signal across the electrodes. Consequently, air molecules from the air surrounding the electrodes are ionized, and are accelerated through the electric field.

As an example, aircraft may include surfaces that have regions where the airflow over the surface is not able to follow the contour of the surface. The airflow is said to "separate" from the surface in these regions. The separation of the airflow from the surface may result in increased fuel consumption, reductions and/or limitations on travel speed and/or range, and the carrying capacity of the aircraft. Previous attempts to prevent airflow separation included blowing and/or suctioning air from orifices in the surface located in or near the separated flow region. Slots were formed in the surface and jets of pulsating air were periodically discharged from the slots to prevent airflow separation. The jets were formed by voice coil based actuators or piezoelectric actuators provided in a linear array along the surface. The use of voice coil based actuators or piezoelectric actuators to prevent airflow separation required a change in the design of the surface to accommodate the actuators. The voice coil based actuators or piezoelectric actuators added weight and expense to the aircraft from the slot, actuators and wires.

DBD plasma actuators have been proposed for use in controlling flow of aircraft. For example, U.S. Pat. No. 7,624,941 to Patel et al, teaches a method of controlling aircraft, missiles, munitions, and ground vehicles with plasma actuators. U.S. Pat. No. 8,016,247 to Schwimley et al teaches a plasma flow control actuator system and method for directional and attitude control, which employs three electrodes. U.S. Pat. No. 8,308,112 to Wood et al teaches a plasma actuator for drag reduction by generating a plasma in air surrounding the surface at a position where the airflow would separate from the surface in the absence of the plasma.

SUMMARY OF THE INVENTION

A dielectric barrier discharge actuator comprising a first electrode disposed adjacent on a surface of a dielectric; a second electrode disposed under the surface and downstream of the first electrode, relative to a flow direction of an ionized layer; an electrical ballast, a third electrode disposed on the surface of the dielectric downstream from the second electrode, connected to the second electrode through the ballast; a series of equal potential strips disposed across the surface of the dielectric and aligned perpendicular to the flow direction of the ionized layer; and a voltage source for applying a voltage across the first and second electrodes, to cause ionization of air between the first electrode and the surface of the dielectric, and to accelerate the ions across the surface of the dielectric; whereby an ionized layer is created when the first electrode is energized by the voltage source.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION OF THE INVENTION

The present invention is directed to an improved dielectric barrier discharge (DBD) plasma actuator.

Figure 1:
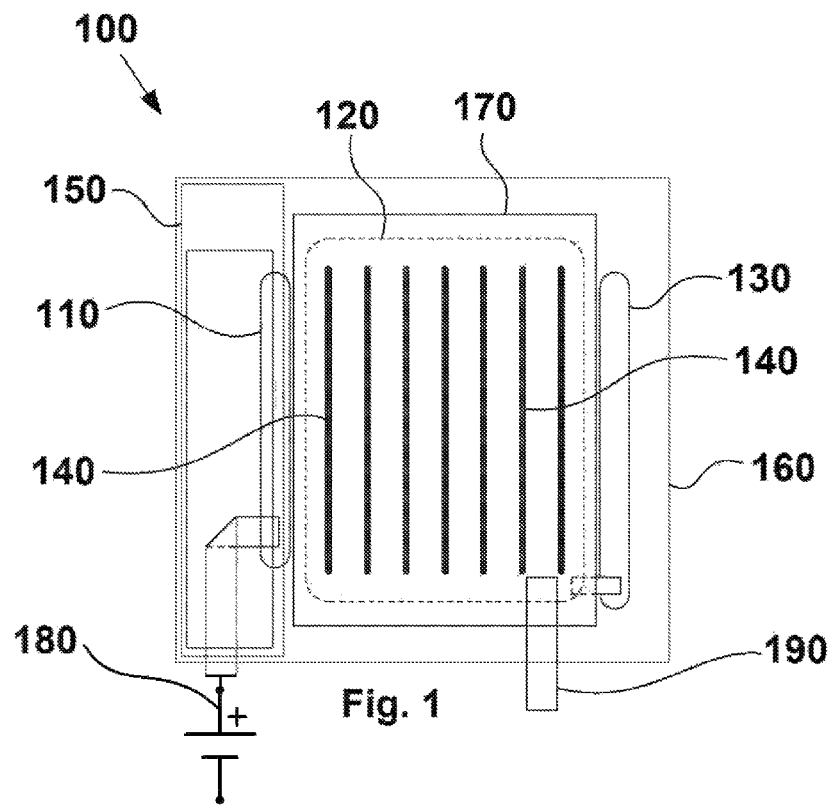
FIG. 1 is a top view of a DBD actuator in accordance with the present invention.
Figure 2:
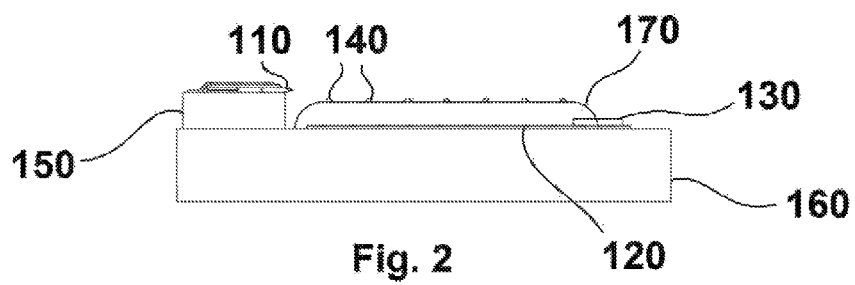
FIG. 2 is a cross-sectional view of the actuator of FIG. 1.

As can be seen in FIGS. 1 and 2, the present invention employs a flat sheet of insulating material (dielectric) with an exposed narrow metal strip (upper electrode) 110 and a buried wide metal strip (lower electrode) 120 that aligns with the edge of the exposed strip. A source of DC high voltage 180 is connected between the upper electrode 110 and lower electrode 120. The lower electrode 120 is connected to a ground connection 190. There is a series of voltage pulses toward zero volts imposed on the DC high voltage. The pulses ionize the air and the DC high voltage accelerates the ionized air. The electrodes can be any electrically conductive material, but preferably copper, stainless steel, and aluminum alloy.

By raising the upper electrode about 0.03" using an insulating spacer 150, an improved engagement of the pulses with the air for better ionization and reduced stress on the dielectric is achieved. The exact composition of the insulating spacer is not critical; however, we have found that if the spacer is porous and allows additional air to pass, there is more thrust. Further, the series of high voltage pulses ionize the air along the edge of the upper electrode 110 at a point closest to the lower electrode 120. The continuous high voltage accelerates the ions which, intern, entrains air along, producing the thrust.

The insulating material, i.e., the dielectric, is preferably a ceramic. An alternative construction is to place the lower electrode on the bottom side of the substrate so that the substrate is the dielectric. With this arrangement the upper surface of the substrate may be coated with ceramic paint or glaze 170 for greatly improved durability. The substrate can be relatively thick and the ceramic layer in the form of a glaze or paint can be made thinner and still effectively protect a less durable substrate such as plastic. Although the thickness of the substrate is not critical, its thickness is on the order of 0.03" to 0.10", while the ceramic glaze is about 0.02 inch. It should be thick enough to protect the substrate.

When the continuous high voltage polarity is positive on the upper electrode 110 with respect to the lower electrode 120, it is our discovery that moderate voltage, about 10,000 volts, produces positive ions by pulling an electron away from the main constituents of the air, $N_2$ and $O_2$, leaving the molecules positively charged. The positive molecules are attracted and accelerated by the lower electrode 120 which thereby produces a modest forward thrust. At higher voltage the nitrogen and oxygen molecules are pulled apart. The separate atoms are more strongly positively charged which produces a stronger forward thrust. These separate atoms aggressively attract electrons which produces visible light.

Figure 4:
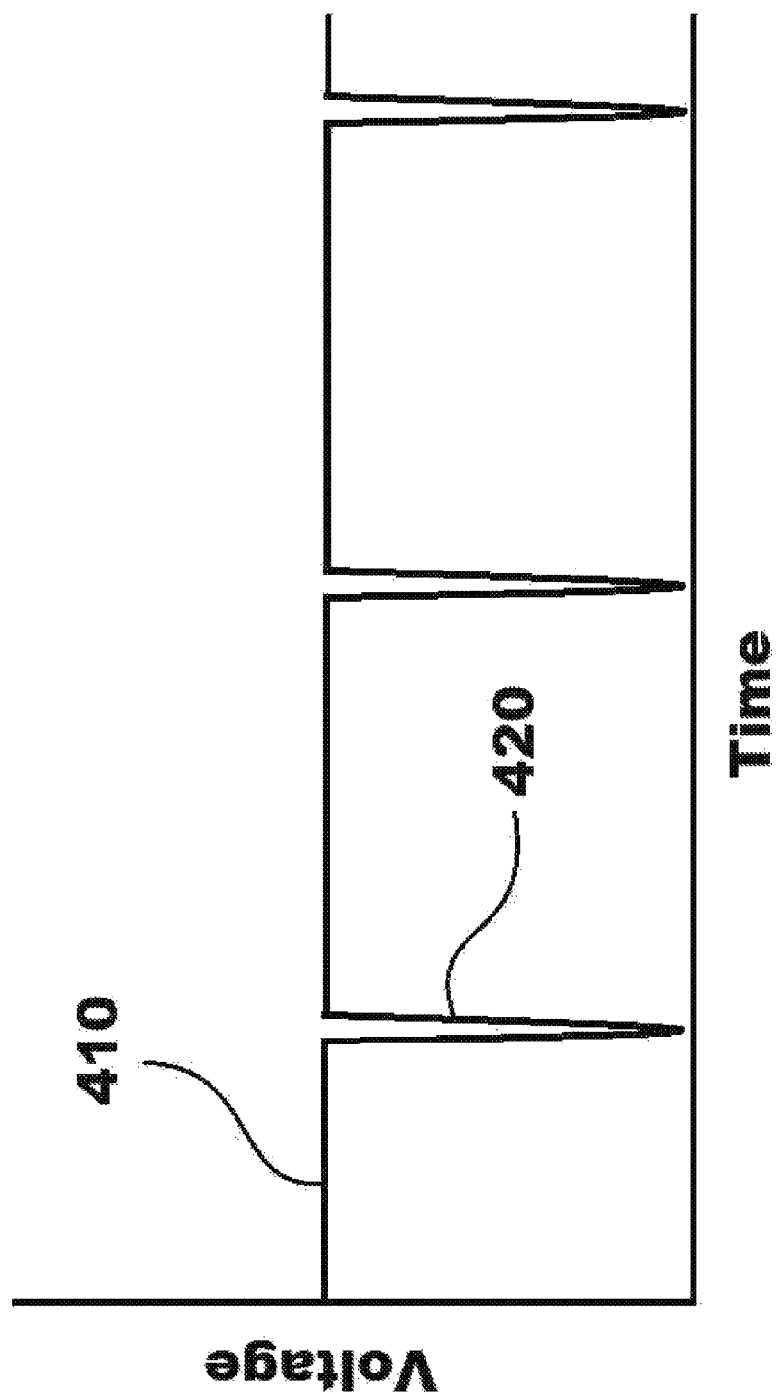
FIG. 4 is a graph of one possible voltage pulse used with the DBD actuator of FIG. 1.
Figure 5:
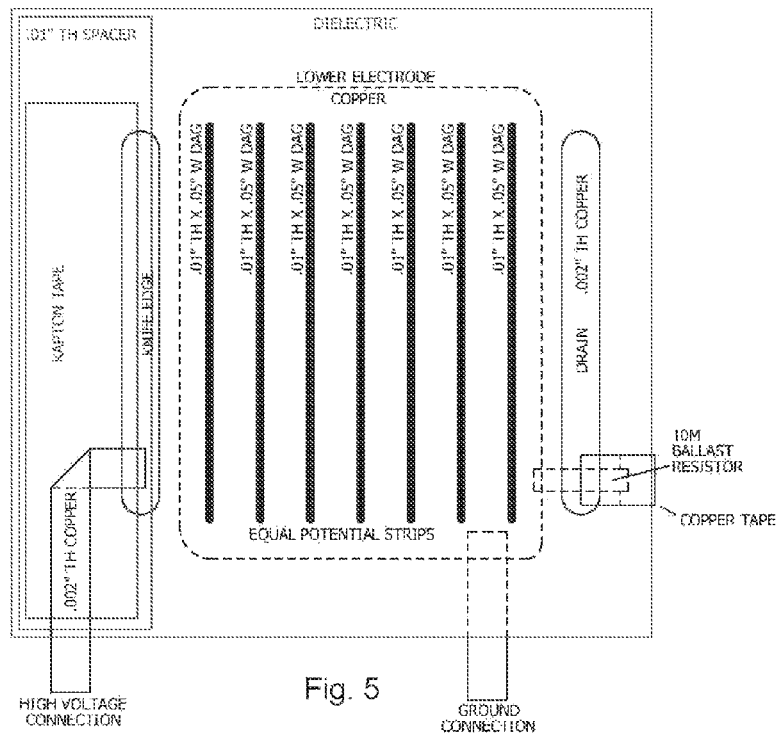
FIG. 5 is a top view of an alternate embodiment of a DBD actuator.
Figure 6:
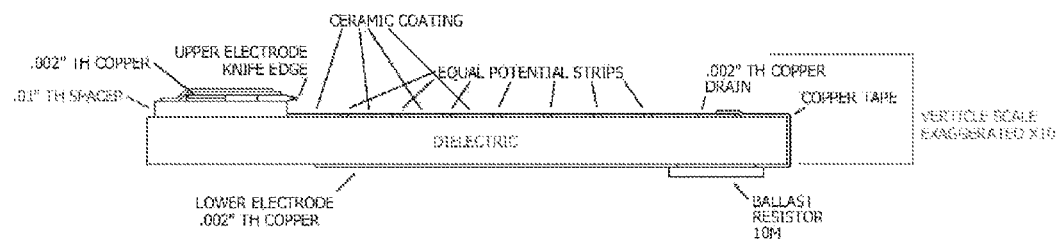
FIG. 6 is a cross-sectional view of the actuator of FIG. 5.

Any number of voltage waveforms can be used with the DBD actuator. One pulse waveform that has proven useful is shown in FIG. 4. It uses a high voltage DC. The waveform is a repeating pulse, with a high voltage DC 410, with periodic spikes to ground 420. The spikes to ground 420 produce the plasma on the DBD, while the high voltage feed 410 causes the plasma to accelerate over the DBD actuator dielectric surface, providing thrust. The exact timing of the pulses is not critical, but one arrangement that has proven beneficial has the spikes 420 descending to zero in 1500 ns and rising in about 300 ns, and the time between pulses is about 2 ms.

To enhance the production of ions, the edge of the upper electrode 110 is straight and sharp, i.e. a "knife edge." This can be achieved by grinding the edge of the upper electrode or by other similar processes.

Figure 3:
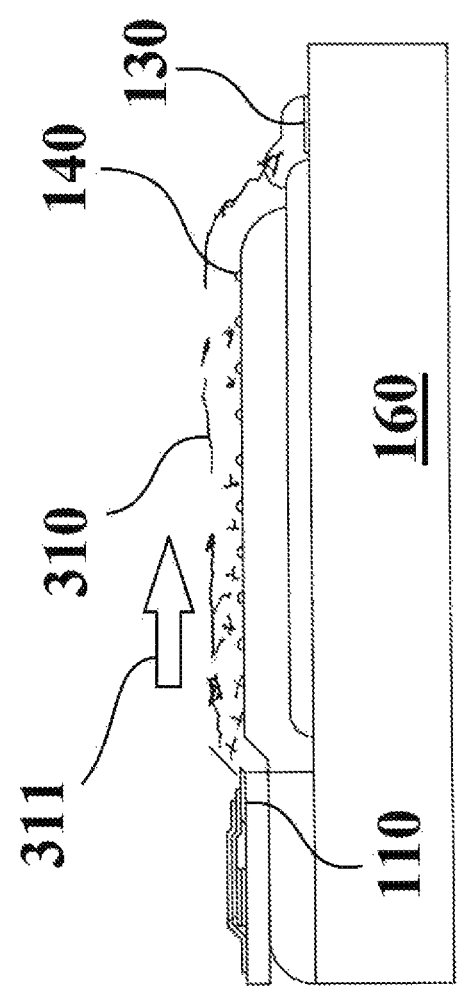
FIG. 3 is a cross-sectional view of the actuator of FIG. 1 showing the plasma flow lines produced by the actuator.

To improve the uniformity of the plasma flow, a series of conductive strips 140 are placed on the upper dielectric surface of the actuator, as can be seen in FIGS. 1 and 2. The conductive strips 140 are oriented parallel to the edge of the upper electrode 110 or perpendicular to the plasma flow direction and spaced at equal distances across the dielectric. FIG. 3 illustrates the plasma flow 310 over the upper surface of the actuator. The plasma 310 flows in a flow direction 311 away from the first electrode 110. The plasma deposits voltages on the conductive strips 140 in a decreasing series from the upper electrode 110 to the last electrode, the drain 130, which is at near zero voltage. The conductive strips also have the advantage of eliminating surface charges that, in the prior art deflect/disrupt the plasma flow.

All corners on the electrodes 110, 120, 130 are rounded to reduce the concentration of the electric field. Sharp corners concentrate the electric field and cause unwanted concentrated discharges (streamers). Curving the edges reduces the concentration. The lower electrode 120 leading edge is rounded to prevent ionization along that edge.

The last conductive strip, the drain 130, has a resistance device of about 10 megohm internally connected to the lower electrode 120, and the ground connection 190. This acts as an electrical ballast. If there is a streamer forming that reaches the drain/ballast 130 (i.e. a precursor to an arc-over), the streamer current into the resistive device lowers the local voltage, preventing further concentration of the discharge current.

A low profile construction can be used on the surface of airfoils such as wings, control surfaces and fan blades. The lower electrode is at the same voltage as the airfoil. Instead of the upper electrode above the dielectric, the upper dielectric can be recessed into the surface of the dielectric with an air gap in front of the sharp edge to allow a space of about 0.03" air gap where the ionization occurs.

Although the invention has been described in detail with reference to particular examples and embodiments, the examples and embodiments contained herein are merely illustrative and are not an exhaustive list. Variations and modifications of the present invention will readily occur to those skilled in the art. The present invention includes all such modifications and equivalents. The claims alone are intended to set forth the limits of the present invention.

I claim:

1. A dielectric barrier discharge actuator comprising:
   a first electrode disposed adjacent to a surface of a dielectric;
   a second electrode disposed under said surface and downstream of said first electrode, relative to a flow direction of an ionized layer;
   an electrical ballast,
   a third electrode disposed on the surface of the dielectric downstream from said second electrode, connected to the second electrode through said ballast;
   a series of equal potential strips disposed across the surface of the dielectric and aligned perpendicular to the flow direction of the ionized layer; and
   a voltage source for applying a voltage across said first and second electrodes, to cause ionization of air between the first electrode and the surface of the dielectric, and to accelerate the ions across the surface of the dielectric;
   whereby an ionized layer is created when said first electrode is energized by said voltage source.

2. The actuator of claim 1 wherein the actuator functions as a plasma actuator for influencing a boundary layer flow over a surface of an object such as to delay separation of a boundary layer.

3. The actuator of claim 1, wherein said voltage source is a direct current (DC) power source.

* * * * *